US006770956B2

United States Patent
Fujimoto et al.

(10) Patent No.: US 6,770,956 B2
(45) Date of Patent: Aug. 3, 2004

(54) SENSOR CIRCUIT MODULE AND ELECTRONIC DEVICE USING THE SAME

(75) Inventors: Katsumi Fujimoto, Toyama-ken (JP); Keiichi Okano, Toyama-ken (JP); Masato Koike, Toyama-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 65 days.

(21) Appl. No.: 10/127,478

(22) Filed: Apr. 23, 2002

(65) Prior Publication Data

US 2002/0167063 A1 Nov. 14, 2002

(30) Foreign Application Priority Data

May 11, 2001 (JP) .......................................... 2001-142074
Feb. 5, 2002 (JP) .......................................... 2002-027881

(51) Int. Cl.$^7$ ............................................. H01L 23/552
(52) U.S. Cl. ..................... 257/659; 257/66; 257/660; 257/684; 257/729; 257/730; 257/778; 257/798
(58) Field of Search ........................... 257/66, 659, 660, 257/684, 729, 730, 778, 798

(56) References Cited

U.S. PATENT DOCUMENTS 5,624,861 A * 4/1997 Shibuya ....................... 438/164

* cited by examiner

*Primary Examiner*—Richard Elms
*Assistant Examiner*—Douglas Menz
(74) *Attorney, Agent, or Firm*—Keating & Bennett, LLP

(57) ABSTRACT

A vibration gyro which is a sensor circuit module includes a packaging substrate, a vibrator mounted on the substrate, a chip type semiconductor element mounted by flip-chip bonding, a chip element, and a cover. The portion of the end surfaces of the packaging substrate in which no through-hole terminals are formed is coated with a light-shielding coating material which is a light-transmission-stopping member. Preferably, the color of the light-shielding coating material is as dark as possible, and is black, if possible.

20 Claims, 9 Drawing Sheets

SENSOR CIRCUIT MODULE AND ELECTRONIC DEVICE USING THE SAME

BACKGROUND OF THE INVENTION

1. Field of the Invention

The present invention relates to a sensor circuit module and an electronic device including such a sensor circuit and, more particularly, to a sensor circuit module such as a vibration gyro for use as a device for correcting video-camera shaking, and an electronic device including such a vibration gyro.

2. Description of the Related Art

FIG. 10 is an exploded perspective view of a vibration gyro which is a sensor circuit module of the related art. In FIG. 10, a vibration gyro 1 includes a packaging substrate 2, a vibrator 4 which is a sensor element mounted onto the packaging substrate, a chip type semiconductor element 5 mounted by flip-chip bonding, a chip element 6 such as a chip resistor or a chip capacitor, and a cover 7. The packaging substrate 2 is made of resin. Four through-hole terminals 3 are provided on end surfaces of the substrate 2, and are formed by splitting each through-hole, which is formed on the packaging substrate 2, substantially into two halves.

Of these components, the semiconductor element 5 contains an integrated circuit having a circuit for driving the vibrator 4 and a circuit for detecting a Colioris force based on a signal output from the vibrator 4. The integrated circuit includes an amplifier circuit having a high amplification factor, since the semiconductor element 5 processes fine signals. The through-hole terminals 3 are used for input and output of a signal and grounding.

FIG. 11 is a perspective view of the semiconductor element 5. In FIG. 11, the semiconductor element 5 includes a semiconductor substrate 5a, a circuit-formation area 5b located in the center of one main surface of the semiconductor substrate 5a, and a plurality of bumps 5c arranged so as to surround the circuit-formation area 5b on the one main surface of the semiconductor substrate 5a.

FIG. 12 is a plan view showing a portion of the packaging substrate 2 onto which the semiconductor element 5 is mounted. As shown in FIG. 12, an area 2b of the packaging substrate 2 for mounting the semiconductor element 5 has a plurality of wiring electrodes 2a disposed thereon so as to correspond to a plurality of the bumps 5c of the semiconductor element 5. The semiconductor element 5 is flip-chip-mounted onto the area 2b of the packaging substrate 2 with the one main surface of the semiconductor element 5 being brought into contact with the area 2b. Thus, a plurality of the bumps 5c is connected to a plurality of the wiring electrodes 2a.

No electrodes are located in a portion of the area 2b of the packaging substrate 2 for mounting the semiconductor element 5, the portion of the area 2b being opposed to the circuit-formation area 5b of the semiconductor element 5 to avoid generation of stray capacitance.

If an external light is irradiated onto the above-described vibration gyro 1, an output signal therefrom is varied. That is, problematically, the vibration gyro 1 malfunctions. This is caused as follows: when a light enters the packaging substrate 2 through an end surface thereof, the light passes through the inside of the packaging substrate 2, and reaches the circuit-formation area of the semiconductor element 5 mounted by flip-chip bonding, and the semiconductor element 5 absorbs the light to generate an electromotive force.

Especially, in the case in which the vibration gyro is used in a video camera, a flash and a remote controller, which are provided for the video camera, and infrared rays applied in infrared-ray communication exert influences so that the vibration gyro often malfunctions. In other words, when a semiconductor, which is not a chip type but is provided with terminals and resin-molded, is used, the above-described problems do not occur.

A light applied from the upper side of the packaging substrate 2 is shielded by the cover 7, while a light from the lower side of the packaging substrate 2 is shielded by an electrode formed on the back-surface of the packaging substrate 2 and an electrode formed on the surface of a printed substrate having the packaging substrate 2 mounted thereon, the electrode being positioned in contact with the back surface of the packaging substrate 2. Accordingly, such lights exert less influence over the semiconductor element 5.

The above-described problems are readily caused when a chip type semiconductor element is mounted by flip-chip bonding. Moreover, when the semiconductor element is mounted with the circuit-formation area thereof being arranged to face upward, and a wiring is formed by wire-bonding, similar problems also occur, due to a light which enters the packaging substrate through an end surface thereof, exits from the surface thereof, and reflects inside the cover.

SUMMARY OF THE INVENTION

In order to overcome the problems described above, preferred embodiments of the present invention provide a sensor circuit module which is prevented from malfunctioning due to an external light entering a packaging substrate via an end surface thereof, and an electronic device including such a sensor circuit module.

According to a preferred embodiment of the present invention, a sensor circuit module includes a packaging substrate, a sensor element mounted onto the packaging substrate, and a chip type semi-conductor element, the packaging substrate being provided with a light-transmission-stopping member arranged to prevent a light from being transmitted to a circuit-formation area of the semiconductor element through an end surface of the packaging substrate.

Preferably, the sensor circuit module further includes a cover for protecting the sensor element and the semiconductor element, the cover being mounted onto the packaging substrate so as not to cover the end surfaces of the packaging substrate.

Also, preferably, the semiconductor element includes an amplifier circuit having a high amplification factor.

Preferably, the light-transmission-stopping member is a light-shielding coating material coated onto the end surfaces of the packaging substrate.

Also, preferably, the end surfaces of the packaging substrate are substantially occupied by through-hole terminals for input and output of a signal and through-hole terminals for light-shielding.

Preferably, as the light-transmission-stopping member, a material constituting the packaging substrate has a low optical transmittance.

Preferably, the material constituting the packaging substrate preferably has an optical transmittance in the wavelength range of about 600 nm to about 1000 nm substantially equal to that in the wavelength range of about 400 nm to about 600 nm.

Preferably, the semiconductor element is mounted by flip-chip bonding, and as the light-transmission-stopping member, an electrode for light-shielding is disposed on the portion of the packaging substrate which is opposed to the circuit-formation area of the semiconductor element.

Preferably, the semiconductor element is mounted by flip-chip bonding, and as the light-transmission-stopping member, a resin having a light-shielding property is filled into a gap between the packaging substrate and the semiconductor element.

According to another preferred embodiment of the present invention, an electronic device includes one of the above-described sensor circuit modules.

The sensor circuit module of preferred embodiments of the present invention, having the above-described configuration, is advantageous in that the module is prevented from malfunctioning due to an external light entering the packaging substrate via an end surface thereof.

The electronic device of other preferred embodiments of the present invention is advantageous in that the performance of the device is greatly improved.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1:
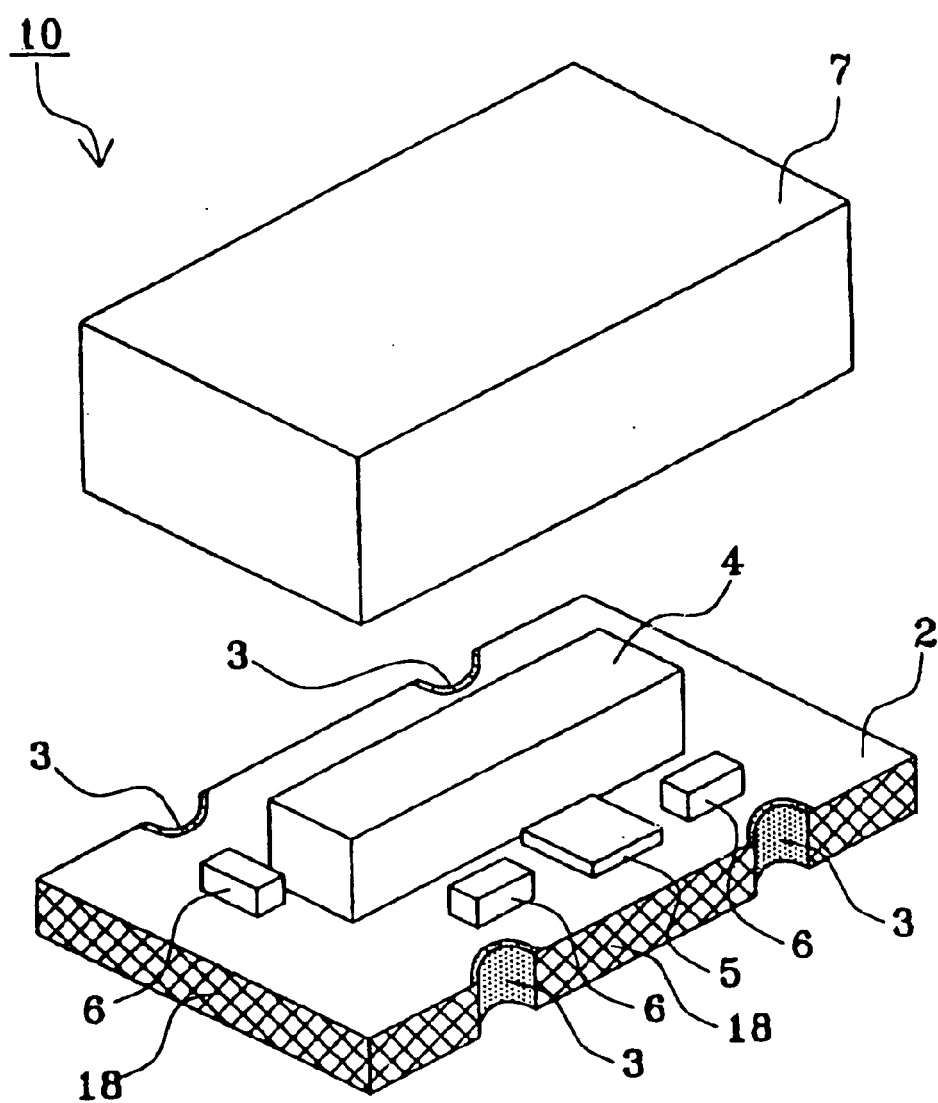
FIG. 1 is an exploded perspective view of a vibration gyro which is an example of the sensor circuit module of a preferred embodiment of the present invention.
Figure 10:
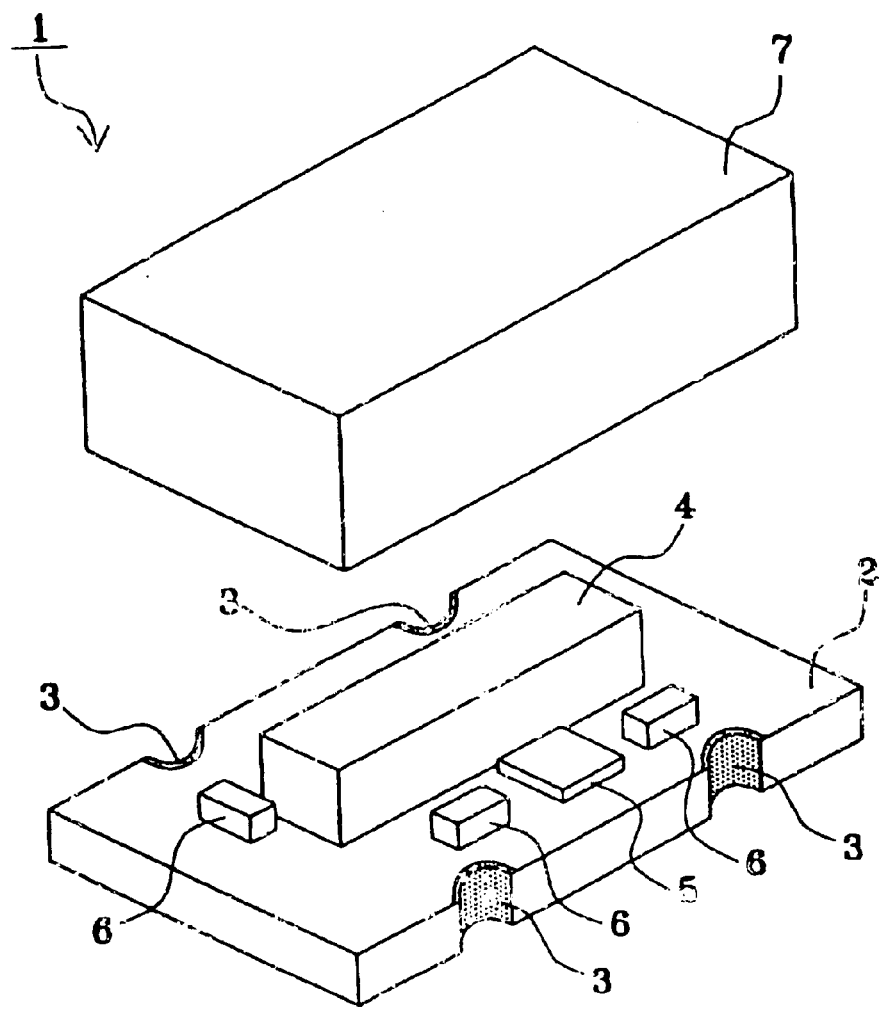
FIG. 10 is an exploded perspective view of a vibration gyro which is a sensor circuit module of the related art.
Figure 11:
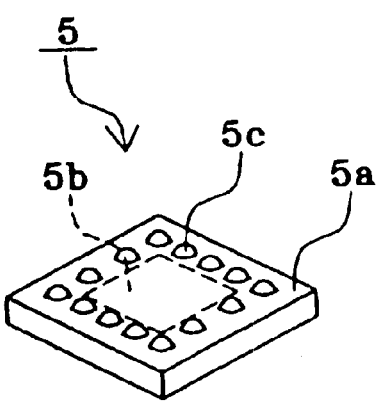
FIG. 11 is a perspective view of a semiconductor element used in the vibration gyro of FIG. 10.
Figure 12:
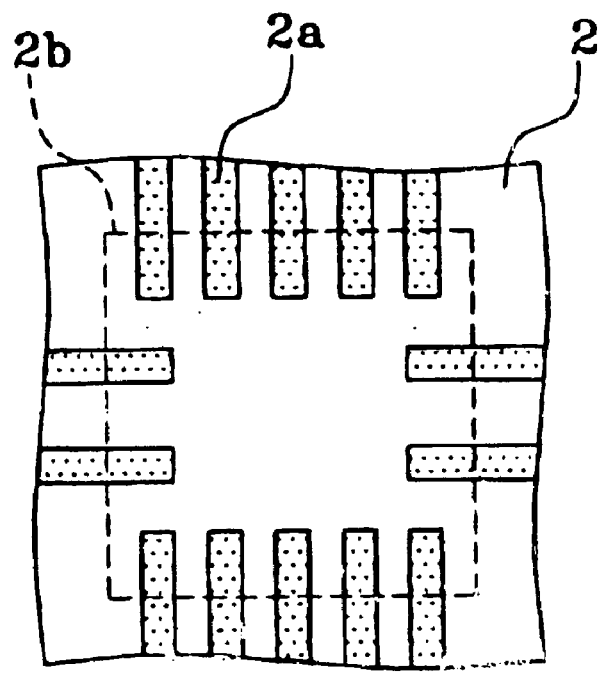
FIG. 12 is a plan view showing the portion of the packaging substrate onto which the semiconductor element is to be mounted in the vibration gyro of FIG. 10.

FIG. 1 is an exploded perspective view of a vibration gyro which is an example of the sensor circuit module of preferred embodiments of the present invention. In FIG. 1, elements which are the same as or are equivalent to those shown in FIG. 10 are designated by the same reference numerals, and repeated description is omitted.

In the vibration gyro 10 shown in FIG. 1, the portion of the end surfaces of the packaging substrate 2 in which the through-hole terminals 3 for output and input of a signal and grounding are not formed is coated with a light-shielding coating material 18 which is a light-transmission stopping member. Preferably, the color of the light-shielding coating material 18 is as dark as possible, and is black, if possible. Moreover, the light-shielding coating material 18 is preferably coated to a large thickness. Especially, for the vibration gyro for use in a video camera, preferably, the light-shielding coating material 18 has a low transmittance of an infrared ray.

Figure 2:
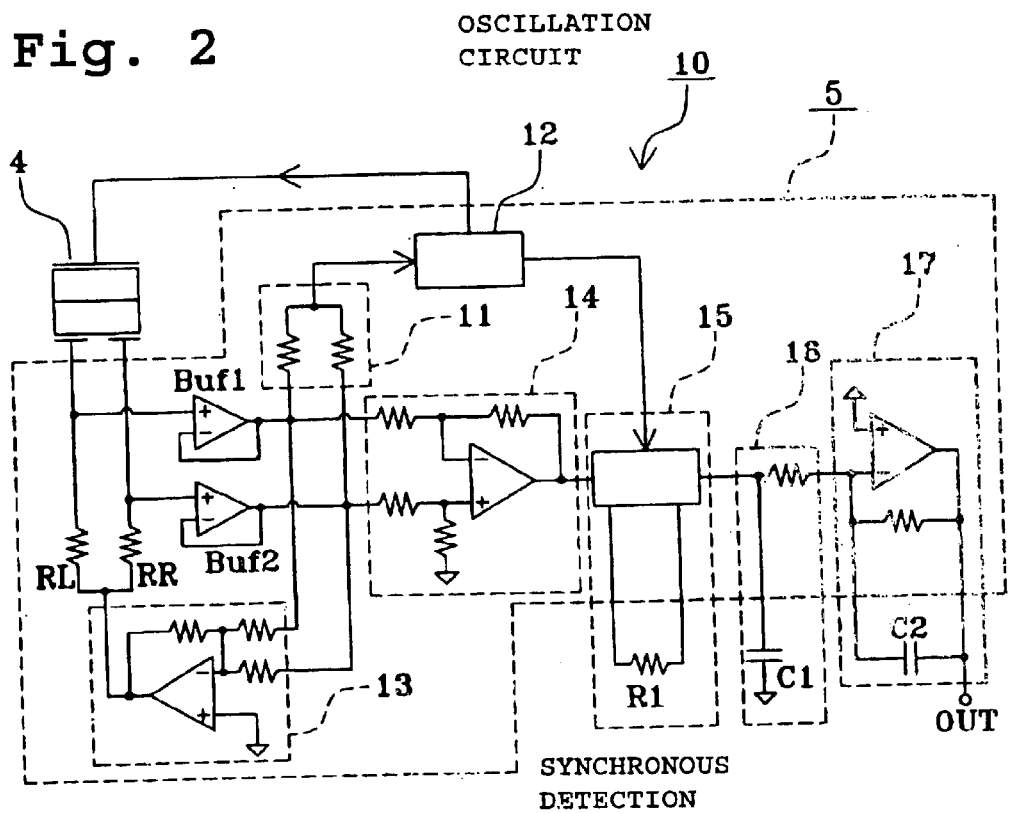
FIG. 2 is a circuit diagram of the vibration gyro of FIG. 1.

FIG. 2 is a circuit diagram of the vibration gyro 10 shown in FIG. 1. In the vibration gyro 10 of FIG. 2, the vibrator 4, which is a sensor element, includes two electrodes for detection and one electrode for driving. The two electrodes for detection of the vibrator 4 are connected to buffer amplifiers Buf1 and Buf2, respectively. Outputs from the buffer amplifiers Buf1 and Buf2 are connected to an oscillation circuit 12 via an addition circuit 11. An output from the oscillation circuit 12 is connected to the drive-electrode of the vibrator 4. Moreover, outputs from the buffer amplifiers Buf1 and Buf2 are connected to a BTL circuit 13, respectively. An output from the BTL circuit 13 is divided in two, which are connected to the detection electrodes of the vibrator 4 via resistors RL and RR, respectively. Moreover, the outputs from the buffer amplifiers Buf1 and Buf2 are connected to a differential amplifier 14. An output from the differential amplifier 14 is connected to a synchronous detection circuit 15. The output from the oscillation circuit 12 is also connected to the synchronous detection circuit 15. An output from the synchronous detection circuit 15 is connected to an output terminal OUT via a smoothing circuit 16 and a DC amplifier 17. All of these elements excluding the vibrator 4, a resistor R1 of the synchronous detection circuit 15, a capacitor C1 of the smoothing circuit 16, and a capacitor C2 of the DC amplifier 17 are integrated onto the semiconductor element 5. That is, plural amplifier circuits having high amplification factors, such as the buffer amplifiers Buf1 and Buf2, the BTL amplifier 13, the differential amplifier 14, and so forth, are disposed on the semiconductor element 5.

The operation of the vibration gyro 10 constructed as described above will be simply described. First, signals output from the two detection electrodes of the vibrator 4 are amplified by the buffer amplifiers Buf1 and Buf2, respectively, and are added in the addition circuit 11, so that the Colioris force component is excluded. The signal is phase-adjusted and amplified in the oscillation circuit 12. Thereafter, the signal is applied to the drive-electrode of the vibrator 4. Thus, the vibration gyro 10 is bending-vibrated by the self-oscillation. In this case, the signal of which the phase is opposite to that of the signals applied to the drive-electrode via the BTL circuit 13 and the resistors RL and RR are applied to the two detection electrodes of the vibrator 4, so that the bending-vibration of the vibrator 4 is more efficient. For signals output from the two detection electrodes of the vibrator 4, the drive-signal component is removed therefrom by the differential amplifier 14. The signals are synchronously detected in the synchronous detection circuit 15, smoothed in the smoothing circuit 16, and is amplified by the DC amplifier 17. Thereby, only the Colioris force component is output from the output terminal OUT.

Figure 3A:
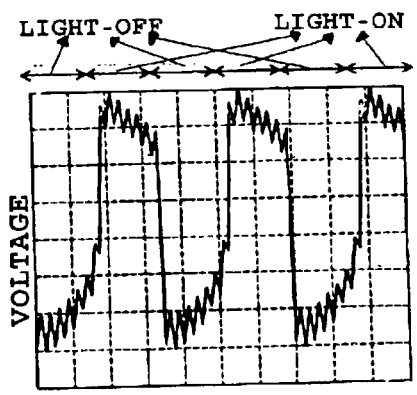
FIGS. 3A and 3B are characteristic graphs showing the changes of outputs from the vibration gyros of FIGS. 1 and 10 caused by light, respectively.
Figure 3B:
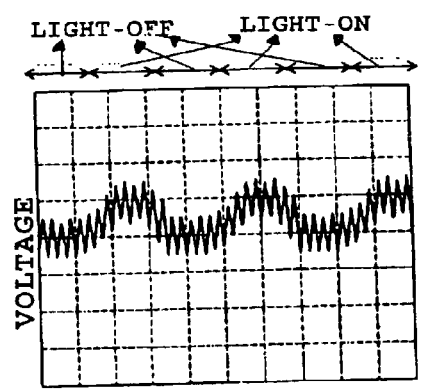

FIGS. 3A and 3B show changes of an output from the vibration gyro 10 configured as described above when a light blinking at a predetermined period is irradiated to the vibration gyro 10. For comparison, FIG. 1A shows the change of an output from the vibration gyro 1 of the related art shown in FIG. 10, and FIG. 1B shows the change of an output form the vibration gyro 10 of FIG. 1 according to preferred embodiments of the present invention. In this case, no angular velocities are applied to the vibration gyros 1 and 10.

As seen in FIGS. 3A and 3B, the difference between the output voltages from the vibration gyro 1 of the related art obtained when the light is turned on and off is large, while that between the output voltages of the vibration gyro 10 according to preferred embodiments of the present invention is reduced to be about a quarter of that of the vibration gyro 1 of the related art.

As described above, in the vibration gyro 10 according to preferred embodiments of the present invention, the light-shielding coating material 18 is applied onto the portion of the end surfaces of the packaging substrate 2 in which the through-hole terminals 3 are not formed. Thus, no light enters through the end surfaces of the packaging substrate 2. An output signal from the vibration gyro 10 is prevented from changing, which may be caused in other devices by a light which enters the packaging substrate and being absorbed by the semiconductor element 5.

Figure 4:
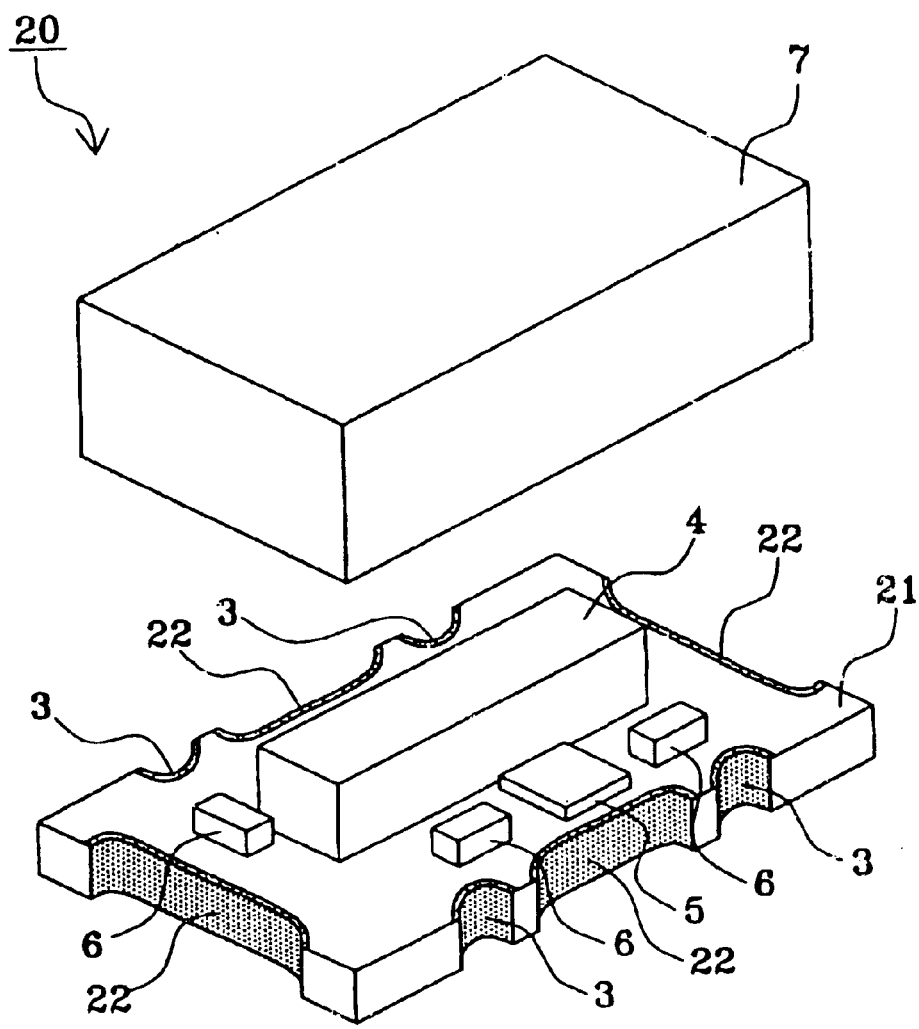
FIG. 4 is an exploded perspective view of a vibration gyro which is another example of the sensor circuit module of a preferred embodiment of the present invention.

FIG. 4 is an exploded perspective view showing a sensor circuit module according to another preferred embodiment of the present invention. In FIG. 4, elements which are the same as or are equivalent to those shown in FIG. 10 are designated by the same reference numerals, and repeated description is omitted.

In a vibration gyro 20 shown in FIG. 4, through-hole terminals 22, which are light-transmission-stopping members, are disposed in the portion of the end surfaces of the packaging substrate 21 of the vibration gyro 20 in which the through-hole terminals 3 for input and output of a signal and grounding are not formed. Thus, a large portion of the end surfaces of the packaging substrate 21 is occupied by the through-hole terminals 3 and 22. Desirably, the through-holes 22 are made of electrodes having such a thickness that a light can not be transmitted through the through-holes 22. Moreover, the through-holes 22 are desirably the largest possible size so that the area on the end surfaces of the packaging substrate 21 excluding the through-hole terminals 3 and 22 is reduced as much as possible. Especially, the through-holes 22 are preferably disposed on the end surfaces of the packaging substrate 21 so as to be larger at positions nearer to the mounting-position of the semiconductor element 5.

In the vibration gyro 20 configured as described above, no light enters the end surfaces of the packaging substrate 21 as in the vibration gyro 10 shown in FIG. 1. Thus, an output signal form the vibration gyro 20 is prevented from changing, which may be caused in other devices by a light entering the packaging substrate and being absorbed into the semiconductor element 5.

It is not needed to connect the through-holes 22 to a circuit in the vibration gyro 20. However, in the high impedance condition, the through-holes 22 may function as antennas, which exert hazardous influences over the operation of the gyro. Accordingly, the through-holes 22, when they are grounded, can be prevented from acting as antennas, and can play a role in electromagnetic shielding.

Moreover, a light-shielding coating material may be coated onto end surfaces of the packaging substrate 21 in which the through-hole terminals 3 and 22 are not formed as in the vibration gyro 10. In this case, high light-shielding effects can be obtained.

Figure 5:
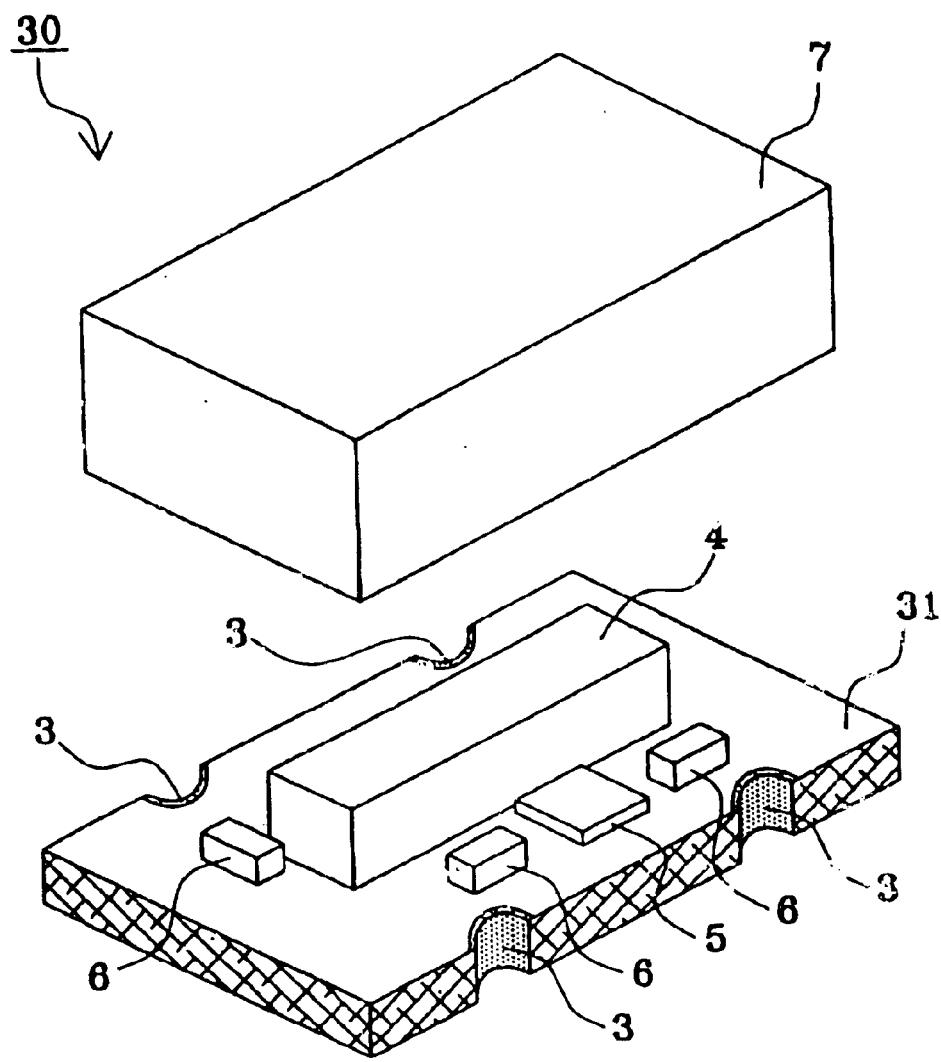
FIG. 5 is an exploded perspective view of a vibration gyro which is still another example of a preferred embodiment of the sensor circuit module of the present invention.

FIG. 5 is an exploded perspective view showing a vibration gyro which is still another example of the sensor circuit module of the present invention. In FIG. 5, elements which are the same as or are equivalent to those shown in FIG. 10 are designated by the same reference numerals, and repeated description is omitted.

In a vibration gyro 30 shown FIG. 5, the material constituting a packaging substrate 31 is preferably a black organic resin material which has a low optical transmittance so that transmission of a light through the substrate 31 is minimized. That is, the material itself constituting the packaging substrate 31 is a light-transmission-stopping member.

Figure 6A:
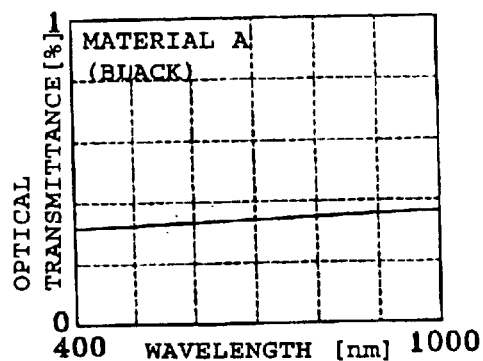
FIGS. 6A to 6D are characteristic graphs showing the optical transmittances of materials constituting a packaging substrate used in the sensor circuit module of a preferred embodiment of the present invention.
Figure 6B:
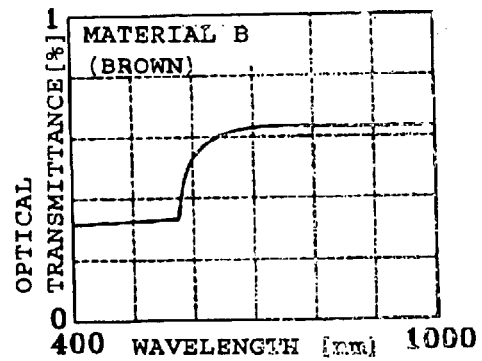

FIG. 6A shows the measurements of the optical transmittance of the black organic resin material (hereinafter, referred to as a material A). For comparison, FIG. 6B shows the measurements of the optical transmittance of a brown organic resin material (hereinafter, referred to as a material B) which is used for the packaging substrate of the sensor circuit module of the related art shown in FIG. 10. For measurement of the optical transmittance, a sheet material having a thickness of about 0.8 mm is preferably used, and a light is applied to one-side surface of the sheet material so as to be transmitted to the other-side surface thereof.

As shown in FIG. 6A, the optical transmittance of the material A is low, that is, in the range of about 0.3 to about 0.35 and shows a relatively flat curve in the overall wavelength-range of from about 400 nm to 1000 about nm.

In the vibration gyro 30 including the packaging substrate made of the above-described material A, a light, even if it enters the packaging substrate 31 through an end surface thereof, is rapidly attenuated, so that the light does not reach the semiconductor element 5. Thus, the light entering the end surface of the packaging substrate 31 is not absorbed by the semiconductor element 5. Accordingly, an output signal from the vibration gyro 30 can be prevented from being changed by the light, which would enter the packaging substrate 31 via an end surface thereof and be absorbed by the semiconductor element 5.

On the other hand, as shown in FIG. 6B, the optical transmittance of the material B is not substantially different from that of the material A in the wavelength range of from about 400 nm to about 600 nm, and is rapidly increased to a level of about 0.6% or higher in the wavelength range exceeding about 600 nm. Thus, it is seen that the material B does not have a sufficient shielding performance for a light having a wavelength in the wavelength range of about 600 nm to about 1000 nm.

In most cases, resins generally used have an optical transmittance which is sufficiently low and uniform in the wavelength range of about 400 nm to about 600 nm. Thus, for the material constituting the packaging substrate of the sensor circuit module, it is required that the optical transmittance in the wavelength range of about 600 nm to about 1000 nm is substantially the same as that in the wavelength range of about 400 nm to about 600 nm.

Figure 6C:
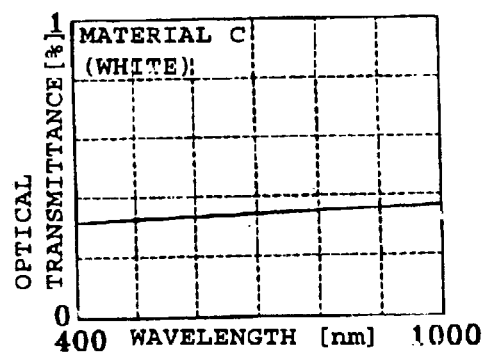
Figure 6D:
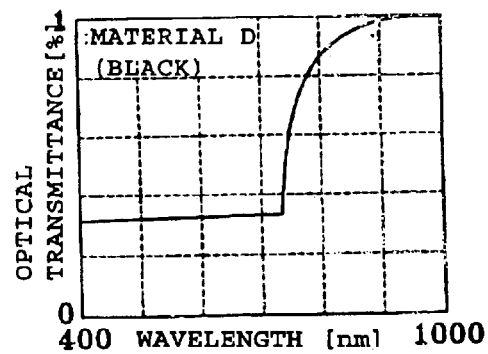

The color of the organic resin does not need to be black, if the optical transmittance is sufficiently low. Moreover, the black color of the resin does not necessarily mean that the resin has a low optical transmittance. For example, some of resin materials containing components having reaction groups sensitive mainly to infrared rays have a low optical transmittance, that is, about 0.35%, and show a relatively flat curve of optical transmittance in the wavelength range of about 400 nm to about 1000 nm, even though the colors are white, as in the case of the organic resin material of FIG. 6C (hereinafter, referred to as a material C). These materials may be used as the material for the packaging substrate. Conversely, some resin materials have such an optical transmittance as is rapidly increased to about 1% in the wavelength range of about 750 nm or larger, even though the colors are black, as in the case of an organic resin material (hereinafter, referred to as a material D) of FIG. 6D. These materials can not be used as the material constituting the packaging substrate. Here, infrared rays are especially referred to, since countermeasures against infrared rays are important. The reasons are as follows: naturally, a light with a short wavelength has a low optical transmittance for resin materials, and visible light does not always enter the inside of a video camera for example, but infrared rays from an internal remote controller often exert hazardous influences over the operation of a vibration gyro.

Moreover, the end surfaces of the packaging substrate 31 may be coated with a light-shielding coating material as in the vibration gyro 10. Also, through-hole terminals may be formed in the end surfaces as in the vibration gyro 20. Thereby, high light-transmission-blocking effects can be obtained.

In the above-described preferred embodiments, a light entering an end surface of the packaging substrate is prevented from reaching the vicinity of the semiconductor element. Moreover, the same operation and effects can be obtained by preventing a light reaching the vicinity of the semiconductor element from being applied to the circuit-formation area.

Figure 7:
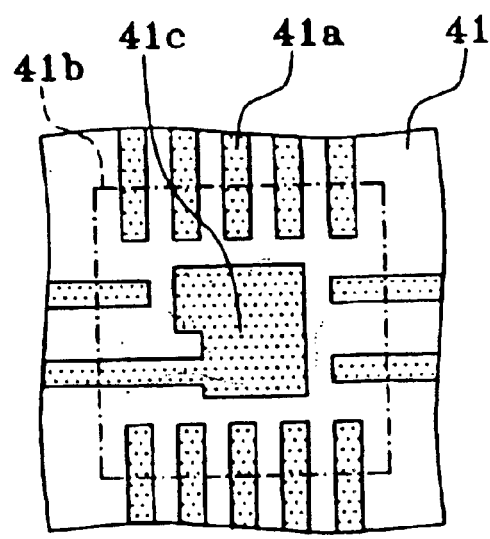
FIG. 7 is a plan view showing the portion of a packaging substrate onto which a semiconductor element is to be mounted in a vibration gyro which is yet another example of a preferred embodiment of the sensor circuit module of the present invention.

FIG. 7 is a plan view of a portion of the packaging substrate of a vibration gyro according to another example of a preferred embodiment of the sensor circuit module of the present invention. As shown in FIG. 7, a plurality of wiring electrodes 41a are arranged so as to correspond to a plurality of the bumps 5c of the semiconductor element 5. An electrode 41c, which is a light-transmission-stopping member, is disposed on a portion of the area 41b of the packaging substrate 41 onto which the semiconductor element 5 is mounted, the portion being opposed to the circuit-formation area 5b of the semiconductor element 5. For example, the electrode 41c is preferably made of copper foil as well as the wiring electrodes 41a, and is grounded.

The semiconductor element 5 is mounted onto the area 41b of the packaging substrate 41 with one main surface of the semiconductor element 5 facing the area 41b, and a plurality of the bumps 5c are connected to a plurality of the wiring electrodes 41a.

When the packaging substrate 41 configured as described above is used, a light which enters a side surface of the packaging substrate 41 and reaches the vicinity of the semiconductor element 5, is shielded by the electrode 41c. Thus, the light is prevented from reaching the circuit-formation area 5b of the semiconductor element 5. Therefore, an output signal from the vibration gyro is prevented from being changed by a light which enters the packaging substrate 41 through an end surface thereof and is absorbed by the semiconductor element 5.

A stray capacity is generated between the electrode 41c and the circuit-formation area 5b of the semiconductor element 5. However, regarding sensor modules such as a vibration gyro, which operate at relatively low frequencies, substantially, the stray capacity is not a problem.

Moreover, the end surfaces of the packaging substrate 41 may be coated with a light-shielding coating material as in the vibration gyro 10. Furthermore, through-hole terminals may be disposed in the end surfaces as in the vibration gyro 20. Also, the packaging substrate may be made of an organic resin material having a low light transmittance as in the vibration gyro 30. In these cases, high light-transmission stopping effects can be obtained.

In the above-described preferred embodiments, the chip type semiconductor element is preferably flip-chip-mounted. The semiconductor element may be mounted with the circuit-formation area thereof being arranged to face upward, and may be wired by wire-bonding. In this case, the same operation and effects can be also obtained.

Figure 8:
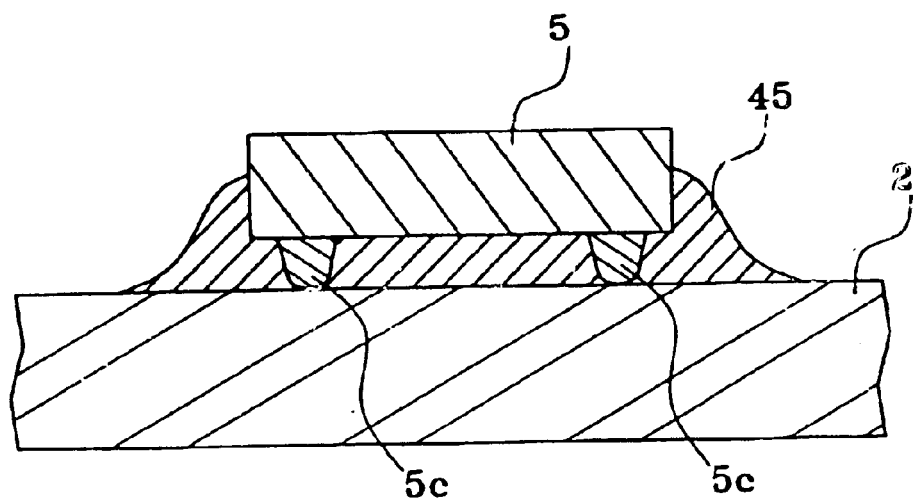
FIG. 8 is a cross-sectional view showing the portion of a vibration gyro which is another example of a preferred embodiment of the sensor circuit module of the present invention, in which a semiconductor device is mounted onto a packaging substrate.

FIG. 8 is a cross-sectional view of the semiconductor element mounted onto the packaging substrate of a vibration gyro which is still another example of the sensor circuit module of a preferred embodiment of the present invention. In FIG. 8, elements which are the same as or are equivalent to those shown in FIG. 10 are designated by the same reference numerals, and repeated description is omitted.

As shown in FIG. 8, the semiconductor element 5 is mounted onto the packaging substrate 2 preferably by flip-chip bonding. A resin 45 having a light-shielding property, which is a light-transmission-stopping member, is filled into a gap between the semiconductor element 5 and the packaging substrate 2. The resin 45 is called an under-filling resin, since it is filled under the semiconductor element 5. Desirably, the color of the resin 45 is as dark as possible, and is black, if possible. The color does not need to be black, provided that the optical transmittance is low. Especially, in the case of video cameras which are often used with remote controllers using infrared rays, desirably, the transmittance of an infrared ray is low.

When the under-filling resin 45 is provided in the gap between the semiconductor element 5 and the packaging substrate 2 as described above, a light which enters an end surface of the packaging substrate 2 and reaches the vicinity of the semiconductor element 5 is shielded by the under-filling resin 45. Thus, the light does not reach the circuit-formation area 5b. Accordingly, an output signal from the vibration gyro can be prevented from being changed, which will be caused by a light entering the end surface of the packaging substrate 2 and being absorbed by the semiconductor element 5.

Moreover, the end surfaces of the packaging substrate 2 may be coated with a light-shielding coating material as in the vibration gyro 10. Furthermore, through-hole terminals may be formed in the end surfaces as in the vibration gyro 20. Also, the packaging substrate may be made of an organic resin material having a low light transmittance as in the vibration gyro 30. An electrode, which is a light-transmission stopping member, may be disposed in the portion of the packaging substrate which is opposed to the circuit-formation area of the semiconductor element, as in the vibration gyro 40. In these cases, high light-transmission stopping effects can be obtained.

In the above-described preferred embodiments, the packaging substrate is preferably made of an organic resin material. However, the material constituting the packaging substrate is not limited onto an organic resin material. Other materials such as ceramics or other suitable material may be used.

Each of the above-described preferred embodiments deals with the vibration gyro as the sensor circuit module of the present invention. However, the sensor circuit module of the present invention is not limited to the vibration gyro, and may be a device which includes a sensor element such as an acceleration sensor, a magnetic sensor, an infrared ray sensor, or other type of sensor, and a chip type semiconductor element having an amplifier circuit with a high amplification factor in which a fine signal output from the sensor element is amplified. The device can be prevented from malfunctioning, which may be caused in other devices by an external light, similarly to the vibration gyros of the above-described preferred embodiments.

Figure 9:
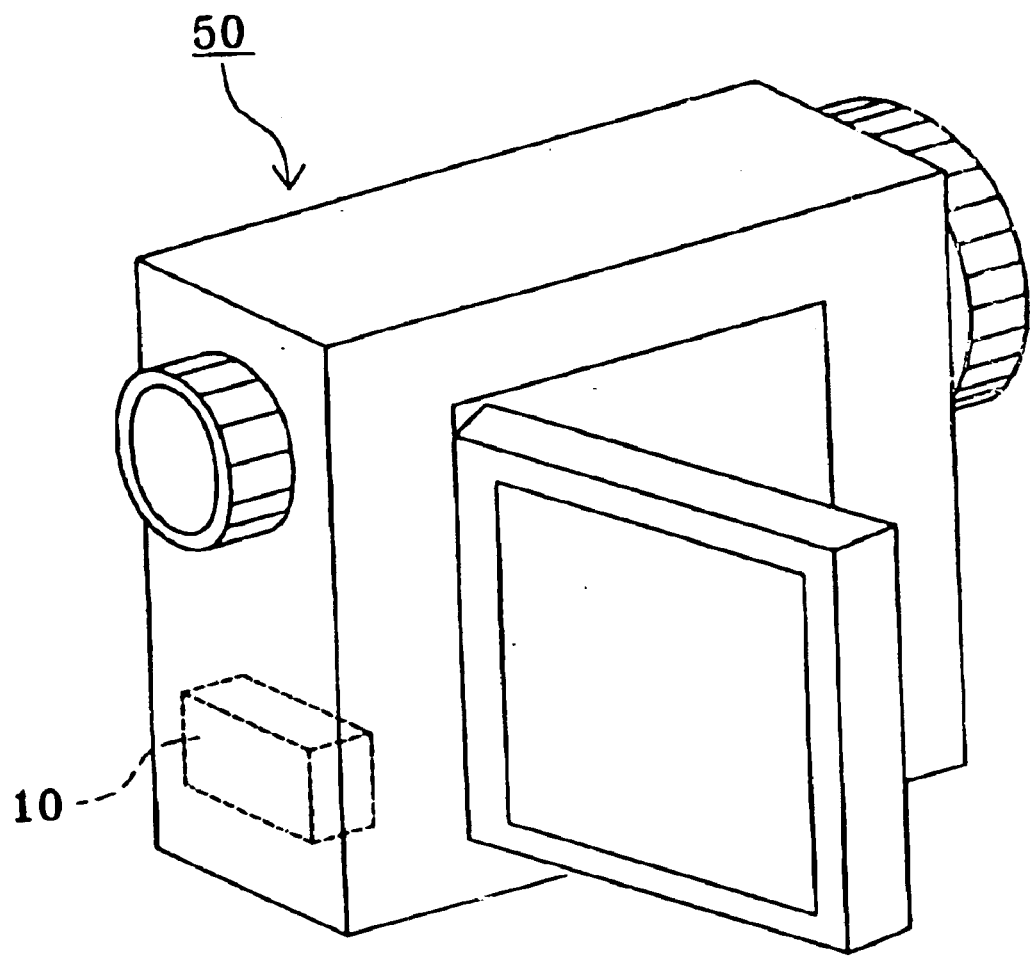
FIG. 9 is a perspective view showing an example of a preferred embodiment of the electronic device of the present invention.

FIG. 9 is a perspective view of a video camera which is an example of the electronic device of another preferred embodiment of the present invention. As shown in FIG. 9, a video camera 50 includes the vibration gyro 10 for correcting camera-shaking, which is the sensor circuit module of other preferred embodiments of the present invention.

According to the video camera 50 configured as described above, accurate information of the angular velocity can be obtained at any time, since the camera 50 is provided with the sensor circuit module of preferred embodiments of the present invention. Thus, the performance of the camera is greatly improved.

The electronic device of this preferred embodiment of the present invention is not limited to the video camera, and may be an electronic device using, e.g, a vibration gyro such as a digital camera having a vibration gyro for correcting camera-shaking, a navigation system having a vibration gyro for position-detecting, a system for detecting turning-over of a motorcar, or other suitable apparatus. Moreover, the electronic device of preferred embodiments of the present invention may be a device using a sensor circuit module other than a vibration gyro.

The sensor circuit module of preferred embodiments of the present invention is prevented from malfunctioning, which may be caused in other devices by an external light entering the module via an end surface of the packaging substrate, since the module includes the packaging substrate, the sensor element mounted onto the packaging substrate, the chip type semi-conductor element, and the light-transmission-stopping member arranged to prevent an external light from being transmitted to the circuit-formation area of the semi-conductor element through an end surface of the packaging substrate.

The electronic device of the present invention includes the sensor circuit module of preferred embodiments of the present invention. Thus, accurate sensor information can be obtained at any moment, and the performance of the device is greatly improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A sensor circuit module comprising:
   a substrate;
   a sensor element mounted on the substrate; and
   a semiconductor element; wherein
   the substrate includes a light-transmission-stopping member arranged on at least a portion of at least one of a plurality of side surfaces of the substrate to prevent a light from being transmitted to an area of the semiconductor element through the substrate.

2. A sensor circuit module according to claim 1, further comprising a cover arranged to protect the sensor element and the semiconductor element, the cover being mounted on the substrate so as not to cover end surfaces of the substrate.

3. A sensor circuit module according to claim 1, wherein the semiconductor element includes an amplifier circuit having a high amplification factor.

4. A sensor circuit module according to claim 1, wherein the light-transmission-stopping member includes a light-shielding coating material coated onto end surfaces of the substrate.

5. A sensor circuit module according to claim 1, wherein end surfaces of the substrate are substantially occupied by through-hole terminals for input and output of a signal and through-hole terminals arranged to shield light.

6. A sensor circuit module according to claim 1, wherein the light-transmission-stopping member includes a material constituting the substrate having a low optical transmittance.

7. A sensor circuit module according to claim 1, wherein the material constituting the substrate has an optical transmittance in the wavelength range of about 600 nm to about 1000 nm substantially equal to that in the wavelength range of about 400 nm to about 600 nm.

8. A sensor circuit module according to claim 1, wherein the semiconductor element is flip-chip bonded to the substrate and the light-transmission-stopping member includes an electrode arranged to shield light and disposed on a portion of the substrate which is opposed to said area of the semiconductor element.

9. A sensor circuit module according to claim 1, wherein the semiconductor element is flip-chip bonded to the substrate and the light-transmission-stopping member includes a resin having a light-shielding property which is filled into a gap between the substrate and the semiconductor element.

10. An electronic device comprising the sensor circuit module defined in claim 1.

11. A sensor circuit module comprising:
    a packaging substrate;
    a sensor element mounted on the packaging substrate; and
    a chip type semiconductor element; wherein
    the packaging substrate includes a light-transmission-stopping member arranged on at least a portion of at least one of a plurality of side surfaces of the packaging substrate to prevent a light from being transmitted to a circuit-formation area of the semiconductor element through an end surface of the packaging substrate.

12. A sensor circuit module according to claim 11, further comprising a cover arranged to protect the sensor element and the semiconductor element, the cover being mounted on the packaging substrate so as not to cover the end surfaces of the packaging substrate.

13. A sensor circuit module according to claim 11, wherein the semiconductor element includes an amplifier circuit having a high amplification factor.

14. A sensor circuit module according to claim 11, wherein the light-transmission-stopping member includes a light-shielding coating material coated onto the end surfaces of the packaging substrate.

15. A sensor circuit module according to claim 11, wherein the end surfaces of the packaging substrate are substantially occupied by through-hole terminals for input and output of a signal and through-hole terminals arranged to shield light.

16. A sensor circuit module according to claim 11, wherein the light-transmission-stopping member includes a material constituting the packaging substrate having a low optical transmittance.

17. A sensor circuit module according to claim 11, wherein the material constituting the packaging substrate has an optical transmittance in the wavelength range of about 600 nm to about 1000 nm substantially equal to that in the wavelength range of about 400 nm to about 600 nm.

18. A sensor circuit module according to claim 11, wherein the semiconductor element is flip-chip bonded to the packaging substrate and the light-transmission-stopping member includes an electrode arranged to shield light and disposed on a portion of the packaging substrate which is opposed to the circuit-formation area of the semiconductor element.

19. A sensor circuit module according to claim 11, wherein the semiconductor element is flip-chip bonded to the packaging substrate and the light-transmission-stopping member includes a resin having a light-shielding property which is filled into a gap between the packaging substrate and the semiconductor element.

20. An electronic device comprising the sensor circuit module defined in claim 11.

* * * * *